(12) United States Patent
Huber et al.

(10) Patent No.: US 6,304,455 B1
(45) Date of Patent: Oct. 16, 2001

(54) SYSTEM, TO BE USED ESPECIALLY IN AN ELECTRONIC CONTROLLER, AND MANUFACTURE OF SAME

(75) Inventors: Elmar Huber, Pfullingen; Rolf Litzinger; Thomas Raica, both of Hechingen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/117,466

(22) PCT Filed: Aug. 22, 1997

(86) PCT No.: PCT/DE97/01810

§ 371 Date: Jul. 28, 1998

§ 102(e) Date: Jul. 28, 1998

(87) PCT Pub. No.: WO98/24157

PCT Pub. Date: Jun. 4, 1998

(30) Foreign Application Priority Data

Nov. 29, 1996 (DE) .............................. 196 49 549

(51) Int. Cl.[7] .............................. H05K 7/10; H01R 43/02
(52) U.S. Cl. .................. 361/761; 361/772; 361/803; 174/52.9; 439/733.1; 29/842
(58) Field of Search .................. 361/28, 736, 756, 361/796, 801, 807, 803, 767–774; 174/52.1; 439/733.1, 928.1, 949, 76.1, 76.2; 29/825, 832, 842, 845

(56) References Cited

U.S. PATENT DOCUMENTS

| | | | |
|---|---|---|---|
| 4,484,158 | * 11/1984 | Roberts et al. | ................... 333/191 |
| 4,879,630 | 11/1989 | Boucard et al. . | |
| 5,263,880 | * 11/1993 | Schwarz et al. | ................... 439/733 |
| 5,359,761 | 11/1994 | Whitson et al. . | |
| 5,408,383 | * 4/1995 | Nagasaka et al. | ................... 361/707 |
| 5,530,287 | 6/1996 | Currie et al. . | |
| 5,595,939 | * 1/1997 | Otake et al. | ................... 437/209 |
| 5,668,698 | * 9/1997 | Jozwiak et al. | ................... 361/752 |
| 5,774,342 | * 6/1998 | Brandenburg et al. | ................... 361/774 |

FOREIGN PATENT DOCUMENTS

| | | |
|---|---|---|
| 637 248 | 7/1983 | (CH) . |
| 41 42 138 | 4/1993 | (DE) . |
| 42 40 755 | 6/1994 | (DE) . |
| 1 95 07 143 | 9/1995 | (DE) . |
| 695 117 | 1/1996 | (EP) . |
| 02 066865 | 3/1990 | (JP) . |

* cited by examiner

Primary Examiner—Jayprakash N. Gandhi
(74) Attorney, Agent, or Firm—Kenyon & Kenyon

(57) ABSTRACT

An arrangement includes a supporting plate, at least one substrate applied thereon for electrical and/or electronic components and a plug-in part. The plug-in part includes a plurality of connector pins which are embedded in insulating material, whose first ends are provided for the connection to external plug-in devices and whose second ends are electrically connected to the substrate via bonding wires. In order to reduce the dimensions of the raster of the connector pins and to achieve a small, compact design of the arrangement, the individual connector pins are manufactured as stamped-out parts whose second ends, in each case, have end faces manufactured in the stamping process and running roughly parallel to the substrate, and the bonding wires are welded directly to the stamped-out end faces of the connector pins. In addition, there is a method for manufacturing the arrangement.

10 Claims, 2 Drawing Sheets

SYSTEM, TO BE USED ESPECIALLY IN AN ELECTRONIC CONTROLLER, AND MANUFACTURE OF SAME

FIELD OF THE INVENTION

The present invention relates to an arrangement for electrical and/or electronic components, in particular for use in an electronic controller, and to a method for manufacturing such an arrangement.

BACKGROUND INFORMATION

German Patent Application No. 42 40 755 describes a conventional arrangement which is particularly used in electronic controllers. The arrangement includes a supporting plate having a printed circuit board substrate applied thereto, which is provided with an electronic circuit and components, and a plug-in part, joined to the support plate, having a plurality of connector pins embedded in an insulating material and leading out of the plug-in part on both sides. The arrangement is connected, e.g., in a motor vehicle, to external plug-in connectors, which can be attached to the first ends of the connector pins. The second ends, facing the printed circuit board, of the connector pins run parallel to the printed circuit board and have end faces aligned perpendicular to the printed circuit board; they are also connected, via bonding wires, to connecting surfaces on the printed circuit board at the stamped-out lateral surfaces. In this context, it is disadvantageous that, with such an arrangement, the space over the lateral surfaces of the connector pins must be kept free, the surfaces being aligned parallel to the printed circuit board substrate and to the support plate, so that, in creating the bonding connections, the bonding tool can be placed onto the connector pins. An arrangement of the connector pins in a plurality of rows is therefore not possible, which, particularly in the case of plug-in parts having very many pins, leads to having to enlarge the plug connector laterally, as a result of which the spatial dimensions of the plug-in part increase disadvantageously and the space requirements become considerable. On the basis of the large distances to the connector pins, which are located further to the outside, it is only heavy-gauge-wire bonding connections having a wire diameter of 0.1 to 0.3 mm that are bonded onto the stamped-out lateral surfaces of the connector pins. In this context, it is disadvantageous that the creation of heavy-gauge-wire bonding connections requires a great deal more time than the creation of small-gauge-wire bonding connections. Furthermore, it is known, in the case, for example, of hybrid circuits, to provide the end faces of connector pins with offsets or plateaus, in order to be able to bond directly onto the plateaus of the connector pins. In this context, it is disadvantageous that an additional cumbersome manufacturing step is required, and that the plug-in part is enlarged overall due to the spatial dimensions of the offsets.

SUMMARY OF THE INVENTION

An arrangement according to the present invention has an advantage that space requirements for connecting the substrate to the connector pins and the width of the plug-in part can be significantly reduced in a simple manner. This is achieved in that the bonding wire is bonded directly onto the stamped-out connecting pin end faces running parallel to the substrate on the supporting plate. The intervals between the connector pins, manufactured as finely precision stamped parts, can be advantageously selected so as to be so small that the dimensions of the raster of the connector pins correspond to the dimensions of the raster of the connecting surfaces on the substrate. In addition, the interval between the connector pins and the connecting surfaces of the substrate can be advantageously reduced, along with the size of the substrate. In this way, a smaller, more compact design of the arrangement is realized overall.

It is particularly advantageous to arrange the connector pins in a plurality of parallel rows in the plug-in part, since all the end faces of the connector pins are freely accessible and the bonding tool, during the creation of the bonding wire connections, can be placed onto the end faces from the side of the supporting plate which is facing the substrate. By arranging the connector pins in a plurality of parallel rows, it is advantageously achieved that the width of the raster of the end faces is not larger than the width of the raster of the connecting surfaces on the substrate, even when the end surfaces are somewhat wider than the connecting surfaces.

Additionally, it is advantageous to coat at least the stamped edge of the connector pins with a metal plating which is applied through electroplating, in order to increase the quality of the welded connection between the bonding wire and the connecting pin.

It is furthermore advantageous for the production of the plug-in part if the second ends of the connector pins protrude a bit from the plug-in part, which is manufactured as an injection-molded part, since then the connector pins, during the injection molding of the plug-in part, can be maintained in adjustment with great precision within the insertion molding die.

It is also advantageous to mount the plug-in part within the cavity of the supporting plate, since in this way the connector pins can be positioned close to the connecting surfaces of the substrate in a particularly simple manner.

Also advantageous is a method for manufacturing an arrangement having a supporting plate and at least one substrate, applied thereon, for electrical and/or electronic components, and having a plug-in part which has, embedded in an insulating material, a plurality of connector pins whose first ends are provided for the connection to external plug-in devices and whose second ends are electrically connected to the substrate via bonding wires, the method including the following steps: free-stamping the connector pins from a metal band retaining a one-sided crosspiece joining the connector pins at their first ends; precision stamping the connector pins; electroplating the connector pins with a contact metal plating; removing the crosspiece; inserting the connector pins into an injection molding die and manufacturing the plug-in part by injection molding using an insulating material; inserting the plug-in part into a cavity of the supporting plate, the plug-in part having connecting pin end faces that run roughly parallel to the substrate; and creating the bonding wire connections between the end faces of the individual connector pins and the substrate on the supporting plate.

Producing the connector pins as simple stamped-out parts is particularly cost-effective. By precision stamping the connector pins, it is advantageously achieved that the connecting pin end faces have the surface quality that is required for wire bonding. The connector pins, in this context, are advantageously maintained via a one-sided connecting piece, which is removed only after the subsequent electroplating coating of the connector pins.

It is particularly advantageous to use small-gauge-wire bonding connections having a wire-diameter of 0.025 to 0.1 mm, whose manufacture, in comparison with the conventional heavy-gauge-wire bonding connections in the Prior Art, can be carried out very much more rapidly.

DETAILED DESCRIPTION OF THE INVENTION

Figure 1:
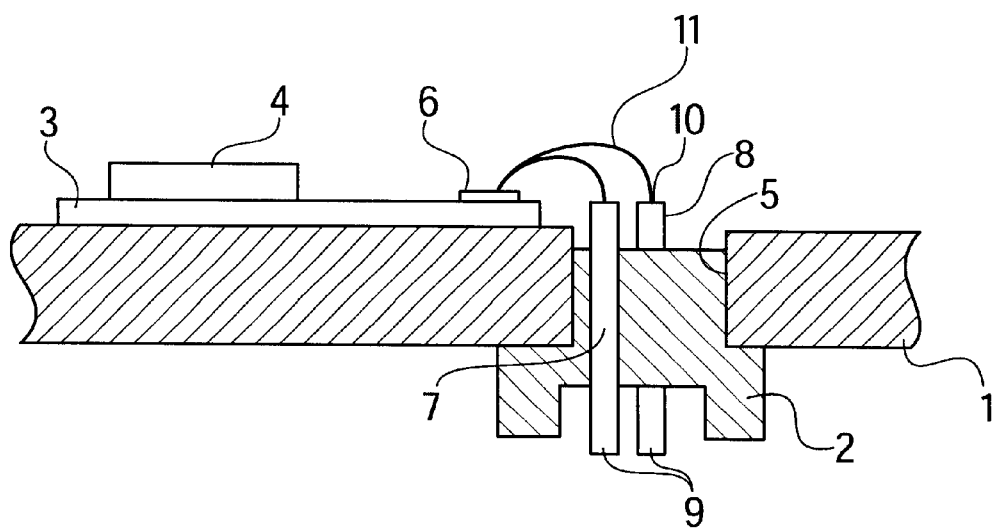
FIG. 1 shows a segment of a cross-section from an arrangement according to the present invention, and having a supporting part and a plug-in part, along line I—I in FIG. 2.
Figure 2:
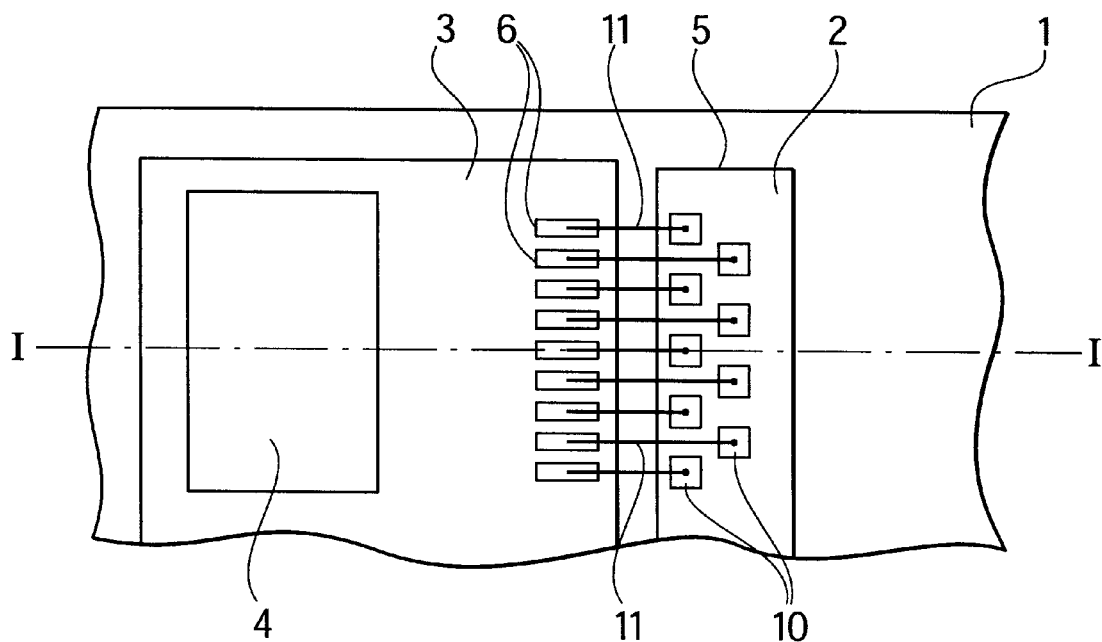
FIG. 2 shows a segment of a top view of the arrangement having a supporting part and a plug-in part.

FIG. 1 shows a cross section of the arrangement of the present invention, which can be used, for example, in an electronic controller of a motor vehicle. The arrangement includes a supporting plate 1, which forms, for example, the base of a controller. On the upper side of supporting plate 1, there is a substrate 3, which can be, for example, a printed circuit board, a hybrid ceramic substrate, or a ceramic multilayer. Substrate 3 includes an electronic circuit having components 4, of which only one is shown in FIG. 1 and FIG. 2. The printed circuit traces, which connect components 4, are not depicted. Substrate 3 has connecting surfaces 6, which are connected to circuit elements and components 4, for connecting to a plug-in part 2, which is secured in a recess 5 of supporting plate 1. This can be accomplished using screws, glue, or in another appropriate manner. Plug-in part 2 is shaped as an injection-molded part and has a plurality of connector pins 7, embedded in insulating material and manufactured as simple stamped-out parts, the connector pins extending out of plug-in part 2 on both sides. The connector pins can be manufactured of, for example, $CuFe_2$ which has been electroplated with nickel and gold, and they have a quadratic cross section of 0.6×0.6 mm. First ends 9 of connector pins 7, extending out from plug-in part 2 on the side of supporting plate 1 facing away from substrate 3, are provided for connection to an external mating connector, whereas second ends 8, protruding on the upper side, facing the substrate, of supporting plate 1, are provided for the electrical connection to substrate 3. The decisive point is that end faces 10 are aligned with the second ends, parallel to substrate 3 and connecting surfaces 6, so that the bonding tool can be brought up to end faces 10 and connecting surfaces 6, and a bonding wire connection can be created between end faces 10 and connecting surfaces 6. Bonding wires 11, depicted in FIG. 1 and FIG. 2, which connect connecting surfaces 6 of substrate 3 and end faces 10 of the connector pins, can be produced using heavy-gauge-wire or small-gauge-wire bonds. With small-gauge-wire bonds, gold wire having a diameter of 0.025 mm to 0.1 mm is used; with heavy-gauge-wire bonds, aluminum wire having a diameter of 0.1 to 0.3 mm is used. Connector pins 7 are arranged in two parallel rows in plug in part 2. However, embodiments having more than two rows are also conceivable. As can be especially noticed in FIG. 2, in plug-in part 2, connector pins 7 are arranged in two rows, one behind, and offset with respect to, the other. The dimensions of the raster of end faces 10 correspond to the raster of connecting surfaces 6 of substrate 3 such that the width of the raster of end faces 10 is not larger than the width of the raster of connecting surfaces 6 and that connecting surfaces 6, and end faces 10 are situated across from each other. In this way, the spatial dimensions of the arrangement are advantageously reduced. Due to the offset arrangement of the two rows of end faces 10, in this context, it is achieved that the bonding wires extending to end faces 10 of the row arranged further from substrate 3 do not overlap (cover) end faces 10 of the row arranged closer to the substrate, so that a bonding wire connection to the front rows can be produced with no difficulty. As a result of the type of arrangement, end sides 10 of the connector pins are arranged close to connecting surfaces 6, so that the bonding connection between the two surfaces is relatively short. Thus both heavy-gauge wire as well as small-gauge wire can be used in the bonding, the heavy-gauge-wire bonding connections being used particularly for high-current connections.

Figure 3:
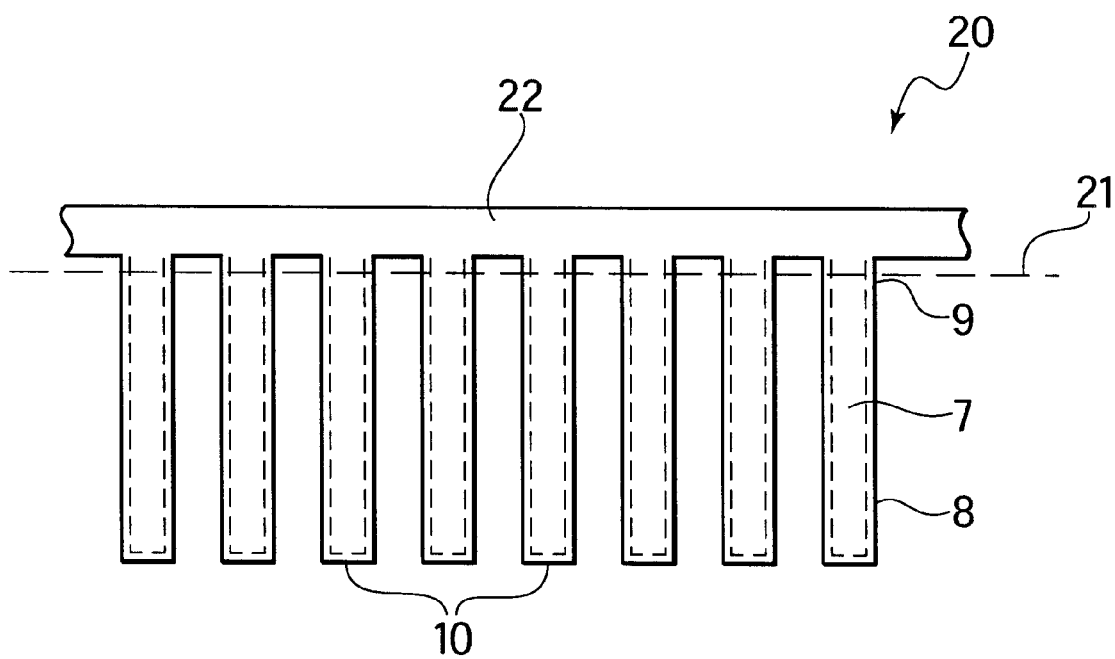
FIG. 3 shows connector pins, connected by a one-sided crosspiece, after a first stamping process.

In the following, a method for manufacturing the arrangement described above is indicated. As illustrated in FIG. 3, the contour of the connector pins is first stamped out in a first stamping step (the solid line) of a metal band 20 made of, for example, $CuFe_2$, a one-sided crosspiece 22 being retained, which joins the connector pins together at their first end 9. At the first stamping step, the straight-cut part corresponds roughly to the broken-cut part, so that the connector pins have to subsequently be stamped once again in a precision stamping step (dotted line in FIG. 3), then obtaining their final shape. The straight-cut part of the stamping edge is significantly higher in the second stamping, so that, in particular, end faces 10 of connector pins 7, which are provided as bonding surfaces, receive a smooth surface structure, which can be bonded to. Subsequently, the connector pins are electroplated, at least at end faces 10, with a gold layer having a lower layer of nickel, and are separated along line 21 in FIG. 3. Pins 7 are inserted into an injection molding die and are coated, at least up to first ends 9 and second ends 8, with an insulating material. With small-gauge-wire bonds, second ends 9 should not protrude any more than 1 mm from the plug-in part; with heavy-gauge-wire bonds, no more than 0.5 mm. The completed plug-in part 2 is mounted in a recess 5 of a supporting plate 1 such that end faces 10 are aligned with second ends 8 of connector pins 7, parallel to connecting surfaces 6 of substrate 3. Subsequently, connecting surfaces 6 are connected to end faces 10 via bonding wires 11 using a bonding tool.

What is claimed is:

1. An arrangement comprising:
   a supporting plate;
   at least one substrate applied on the supporting plate and provided for electrical components; and
   a plug-in part including a plurality of connector pins embedded in an insulating material, each of the plurality of connector pins including a first end and a second end, the first end being connected to external plug-in devices, the second end being electrically connected to the at least one substrate via bonding wires, an axis of each of the connector pins running vertically with respect to the at least one substrate,
   wherein the plurality of connector pins are produced using a stamping technique, wherein the second end includes an end face produced using the stamping technique and that is different than a lateral surface of the corresponding connector pin, the end face extending substantially parallel to the at least one substrate, and wherein the bonding wires are welded directly to the end face.

2. The arrangement according to claim 1, wherein the arrangement is integrated in an electronic controller.

3. The arrangement according to claim 1, wherein the plurality of connector pins are positioned in at least two rows in the plug-in part.

4. The arrangement according to claim 1, wherein each of the plurality of connector pins is coated at the end face with a metal plating material, the metal plating material being applied on the end face by an electroplating technique.

5. The arrangement according to claim 1, wherein the second end slightly extends away from the plug-in part, and wherein an injection molding part includes the plug-in part.

6. The arrangement according to claim 1, wherein the plug-in part is situated in a recess of the supporting plate.

7. A method for manufacturing an arrangement, comprising the steps of:

applying at least one substrate on a supporting plate; the at least one substrate being provided for electrical components;

embedding a plurality of connector pins of a plug-in part in an insulating material, each of the plurality of connector pins including a first end and a second end, the first end being connected to external plug-in devices, the second end being electrically connected to the at least one substrate using bonding wires, an axis of each of the connector pins running vertically with respect to the at least one substrate;

free-stamping the plurality of connector pins from a metal band, retaining a crosspiece, the crosspiece joining the plurality of connector pins at the first ends;

fine-stamping each of the plurality of connector pins;

electroplating an end face of the second end using a contact metallization procedure, the end face being different than a lateral surface of the corresponding connector pin;

removing the crosspiece;

inserting the plurality of connector pins into an injection molding die;

inserting the plug-in part into a recess of the supporting plate so that the end face extends substantially parallel to the at least one substrate; and coupling the end face and the at least one substrate via the bonding wires.

8. The method according to claim 7, wherein the arrangement is integrated in an electronic controller.

9. The method according to claim 7, wherein the fine-stamping step includes fine-stamping each of the plurality of connector pins at the end face.

10. The method according to claim 7, wherein the bonding wires include a small-gauge wire having a diameter between 0.025 mm and 0.1 mm.

* * * * *